United States Patent
Aga et al.

(10) Patent No.: US 6,600,218 B2
(45) Date of Patent: Jul. 29, 2003

(54) SEMICONDUCTOR DEVICE

(75) Inventors: Fumiaki Aga, Tokyo (JP); Namiki Moriga, Tokyo (JP); Hiroshi Horibe, Tokyo (JP); Yasuhito Suzuki, Tokyo (JP); Akira Takaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/153,620

(22) Filed: May 24, 2002

(65) Prior Publication Data

US 2003/0052394 A1 Mar. 20, 2003

(30) Foreign Application Priority Data

Sep. 14, 2001 (JP) ........................................ 2001-280020

(51) Int. Cl.[7] ............................................... H01L 23/02
(52) U.S. Cl. ..................... 257/678; 257/690; 257/693; 257/723; 257/730
(58) Field of Search ................................. 257/678–733

(56) References Cited

U.S. PATENT DOCUMENTS

| | | | | |
|---|---|---|---|---|
| 5,395,035 A | * | 3/1995 | Nakao | 228/4.5 |
| 6,087,722 A | * | 7/2000 | Lee et al. | 257/723 |
| 6,184,585 B1 | * | 2/2001 | Martinez et al. | 257/777 |
| 6,373,140 B1 | * | 4/2002 | Onodera et al. | 257/780 |
| 6,414,386 B1 | * | 7/2002 | Beaulieu et al. | 257/691 |
| 2001/0020735 A1 | * | 9/2001 | Chikawa et al. | 257/678 |

* cited by examiner

*Primary Examiner*—Hoai Ho
*Assistant Examiner*—Andy Huynh
(74) *Attorney, Agent, or Firm*—McDermott, Will & Emery

(57) ABSTRACT

A semiconductor device comprises a semiconductor chip. The semiconductor chip has an internal active region, an external active region, and a plurality of electrodes for electrically connecting the internal active region and the external active region to outside thereof, respectively. The semiconductor device also comprises a boarding portion that carries the semiconductor chip, a plurality of external electrode terminals for electrical connection to an external device, a plurality of connecting wires each connecting the electrode of the semiconductor chip and the external electrode terminal; and a mold resin that seals the semiconductor chip, the boarding portion and the connecting wires. The electrodes are disposed around the internal active region, and the external active region is disposed outside the electrodes.

17 Claims, 10 Drawing Sheets

Fig. 2

| | item | Mold resin A | Mold resin B |
|---|---|---|---|
| composition | mainly agent | resins of cresol novolac family | resins of biphenyl family |
| | hardening agent | resins of cresol novolac family | resins of phenol family |
| | catalyst | phosphorus family | phosphorus family |
| | amount of filler | 80wt% | 87wt% |
| flowing properties | spiral flow | 140cm | 110cm |
| | gel time | 30sec | 25sec |
| | melting viscosity | 9.0Pa·s | 13.0Pa·s |
| condensed matter | glass-transition point | 150°C | 130°C |
| | line expansion coefficient $\alpha 1$ | $1.3 \times 10^{-5}$ | $1.0 \times 10^{-5}$ |
| | line expansion coefficient $\alpha 2$ | $5.0 \times 10^{-5}$ | $4.5 \times 10^{-5}$ |
| | modulus of elasticity | 20000N/mm$^2$ | 23000N/mm$^2$ |
| | flexural strength | 150N/mm$^2$ | 180N/mm$^2$ |
| | rate of water absorption | 0.5% | 0.4% |
| | fire retardance | UL94V-0 | UL94V-0 |

Fig. 3

| Group | No. | Schematic diagrams | length of gold wire | | | | length of gold wire (max.) | above-chip loop length | loop height | |
|---|---|---|---|---|---|---|---|---|---|---|
| | | | a | b | c | d | | | first | second |
| I | 1 | c　　d<br>　▨　<br>a　　b | 6.82 mm | 6.82 mm | 6.82 mm | 6.82 mm | 6.82 mm | 4.1 mm | 350 μm | 170 μm |
| I | 2 | c　▨d<br>　　　<br>a　　b | 6.82 mm | 5.72 mm | 5.72 mm | 3.51 mm | 6.82 mm | 41 mm | 350 μm | 170 μm |
| I | 3 | c　　d<br>　　　<br>a　▨b | 5.72 mm | 3.51 mm | 6.82 mm | 5.72 mm | 6.82 mm | 4.1 mm | 350 μm | 170 μm |
| I | 4 | c　　d<br>　　　<br>a▨　b | 3.51 mm | 5.72 mm | 5.72 mm | 6.82 mm | 6.82 mm | 4.1 mm | 350 μm | 170 μm |
| I | 5 | c▨　d<br>　　　<br>a　　b | 5.72 mm | 6.82 mm | 3.51 mm | 5.72 mm | 6.82 mm | 4.1 mm | 350 μm | 170 μm |
| II | 6 | c　　d<br>　▨　<br>a　　b | 4.95 mm | 4.95 mm | 4.95 mm | 4.95 mm | 4.95 mm | 2.1 mm | 350 μm | 200 μm |
| II | 7 | c　▨d<br>　　　<br>a　　b | 4.95 mm | 4.42 mm | 4.42 mm | 3.41 mm | 4.95 mm | 2.1 mm | 350 μm | 200 μm |
| II | 8 | c　　d<br>　　　<br>a　▨b | 4.42 mm | 3.41 mm | 4.95 mm | 4.42 mm | 4.95 mm | 2.1 mm | 350 μm | 200 μm |
| II | 9 | c　　d<br>　　　<br>a▨　b | 3.41 mm | 4.42 mm | 4.42 mm | 4.95 mm | 4.95 mm | 2.1 mm | 350 μm | 200 μm |
| II | 10 | c▨　d<br>　　　<br>a　　b | 4.42 mm | 4.95 mm | 3.41 mm | 4.42 mm | 4.95 mm | 2.1 mm | 350 μm | 200 μm |

 internal active region

Fig. 4

| Group | No. | Schematic diagrams | flowcurvature of gold wire average | flowcurvature of gold wire max. | approach of gold wire | distance between gold wire and end pportion | shift amount of die pad average | shift amount of die pad max. | evaluation |
|---|---|---|---|---|---|---|---|---|---|
| I | 1 | c　　d<br>　▨　<br>a　　b | 4.7% | 7.4% | 28μm or more | Min. 0μm | 14μm | 33μm | NG |
| I | 2 | c　▨d<br>　　　<br>a　　b | 4.6% | 7.7% | 28μm or more | Min. 13μm | 7μm | 23μm | OK |
| I | 3 | c　　d<br>　　　<br>a▨　b | 4.3% | 8.0% | 28μm or more | Min. 8μm | 38μm | 46μm | OK |
| I | 4 | c　　d<br>　　　<br>a▨　b | 4.5% | 8.1% | 28μm or more | Min. 12μm | 65μm | 84μm | OK |
| I | 5 | c▨　d<br>　　　<br>a　　b | 4.4% | 8.0% | 28μm or more | Min. 5μm | 37μm | 53μm | OK |
| II | 6 | c　　d<br>　▨　<br>a　　b | 4.5% | 7.6% | 50μm or more | Min. 22μm | 39μm | 53μm | OK |
| II | 7 | c　▨d<br>　　　<br>a　　b | 5.1% | 8.7% | 50μm or more | Min. 71μm | 38μm | 62μm | OK |
| II | 8 | c　　d<br>　　　<br>a　▨b | 4.5% | 8.2% | 50μm or more | Min. 31μm | 46μm | 60μm | OK |
| II | 9 | c　　d<br>　　　<br>a▨　b | 4.4% | 7.9% | 50μm or more | Min. 32μm | 51μm | 57μm | OK |
| II | 10 | c▨　d<br>　　　<br>a　　b | 4.4% | 8.5% | 50μm or more | Min. 32μm | 45μm | 57μm | OK |

 internal active region

①② : closest to the mold resin inlet
③④ : closest to the right corner
⑤⑥ : closest to the opposite corner
⑦⑧ : closest to the left corner

| No. | Schematic diagrams | length of gold wire (max.) | above-chip loop length | loop height | | top loop length | die pad sinking amount |
|---|---|---|---|---|---|---|---|
| | | | | first | second | | |
| 11 | | 7.07 mm | 4.30 mm | 350 μm | 310 μm | 60% | 300 μm |
| 12 | | 6.06 mm | 3.30 mm | 350 μm | 310 μm | 60% | 300 μm |
| 13 | | 5.03 mm | 2.31 mm | 350 μm | 290 μm | 60% | 300 μm |
| 14 | | 3.91 mm | 1.33 mm | 300 μm | 300 μm | 30% | 250 μm |
| 15 | | 3.91 mm | 1.33 mm | 300 μm | 300 μm | 60% | 250 μm | internal active region

| No. | Schematic diagrams | flowcurvature of gold wire | | approach of gold wire | distance between gold wire and end pportion | shift amount of die pad | | evaluation |
|---|---|---|---|---|---|---|---|---|
| | | average | max. | | | average | max. | |
| 11 | | 7.3% | 8.7% | 28 μm or more | Min. 59 μm | 12 μm | 41 μm | OK |
| 12 | | 7.5% | 8.5% | 28 μm or more | Min. 21 μm | 12 μm | 37 μm | OK |
| 13 | | 7.3% | 8.4% | 50 μm or more | Min. 110 μm | 20 μm | 67 μm | OK |
| 14 | | 2.0% | 3.6% | 50 μm or more | Min. 161 μm | 12 μm | 18 μm | OK |
| 15 | | 2.1% | 3.0% | 50 μm or more | Min. 115 μm | 6 μm | 26 μm | OK | internal active region

Fig. 9

| No. | Schematic diagrams | length of gold wire (max.) | above-chip loop length | loop height first | loop height second | top loop length | die pad sinking amount |
|---|---|---|---|---|---|---|---|
| 1 | c  d / [▨ centered] / a  b | 5.0 mm | 0.53 mm (10.2%) | 350 μm | 330 μm | 60% | 300 μm |
| 2 | c [▨]d / a  b | 5.0 mm | 1.58 mm (30.3%) | 350 μm | 330 μm | 60% | 300 μm |
| 3 | c [▨]d / a  b | 5.0 mm | 2.49 mm (47.8%) | 350 μm | 330 μm | 60% | 300 μm |
| 4 | c [▨]d / a  b | 5.0 mm | 3.43 mm (65.8%) | 250 μm | 210 μm | 60% | 300 μm |
| 5 | c [▨]d / a  b | 5.0 mm | 3.43 mm (65.8%) | 350 μm | 330 μm | 60% | 300 μm |
| 6 | c  d / [▨ centered] / a  b | 6.0 mm | 0.86 mm (14.4%) | 350 μm | 330 μm | 60% | 300 μm |
| 7 | c [▨]d / a  b | 6.0 mm | 1.79 mm (29.9%) | 350 μm | 330 μm | 30% | 300 μm |
| 8 | c [▨]d / a  b | 6.0 mm | 1.79 mm (29.9%) | 350 μm | 330 μm | 60% | 300 μm |
| 9 | c [▨]d / a  b | 6.0 mm | 3.19 mm (53.3%) | 350 μm | 330 μm | 60% | 300 μm |
| 10 | c [▨]d / a  b | 6.0 mm | 3.92 mm (65.6%) | 350 μm | 330 μm | 60% | 300 μm |

 ▨ internal active region

Fig.10

| No. | Schematic diagrams | flowcurvature of gold wire | | approach of gold wire | distance between gold wire and end pportion | shift amount of die pad | | evaluation |
|---|---|---|---|---|---|---|---|---|
| | | average | max. | | | average | max. | |
| 1 | c d<br>▨<br>a b | 5.1% | 5.6% | 28 μm or more | Min. 208 μm | 23 μm | 45 μm | OK |
| 2 | c ▨ d<br><br>a b | 4.6% | 5.1% | 28 μm or more | Min. 133 μm | 32 μm | 40 μm | OK |
| 3 | c ▨ d<br><br>a b | 3.6% | 4.5% | 28 μm or more | Min. 137 μm | 43 μm | 68 μm | OK |
| 4 | c ▨ d<br><br>a b | 2.7% | 3.4% | 28 μm or more | Min. 86 μm | 8 μm | 22 μm | OK |
| 5 | c ▨ d<br><br>a b | 3.2% | 3.5% | 28 μm or more | Min. 128 μm | 26 μm | 43 μm | OK |
| 6 | c d<br>▨<br>a b | 5.4% | 5.6% | 28 μm or more | Min. 142 μm | 17 μm | 37 μm | OK |
| 7 | c ▨ d<br><br>a b | 5.1% | 5.7% | 28 μm or more | Min. 146 μm | 25 μm | 41 μm | OK |
| 8 | c ▨ d<br><br>a b | 5.8% | 6.3% | 28 μm or more | Min. 156 μm | 21 μm | 39 μm | OK |
| 9 | c ▨ d<br><br>a b | 4.3% | 5.1% | 28 μm or more | Min. 174 μm | 27 μm | 36 μm | OK |
| 10 | c ▨ d<br><br>a b | 4.5% | 5.2% | 28 μm or more | Min. 175 μm | 48 μm | 70 μm | OK |

SEMICONDUCTOR DEVICE

BACKGROUND OF THE INVENTION

1. Field of the Invention

The present invention relates to a semiconductor device. More specifically, the present invention relates to a semiconductor device that can prevent approaching or contacting of a plurality of connecting wires connecting a semiconductor chip to external electrode terminals with each other, or the connecting wires with the semiconductor chip in the manufacture of the semiconductor device.

2. Background Art

FIG. 11 is a schematic diagram for illustrating a conventional semiconductor device, FIG. 11A being a top perspective view, and FIG. 11B being a sectional view.

In a semiconductor device 200 as shown in FIGS. 11A and 11B, an internal active region 4 is formed on the surface of a boarded semiconductor chip 2, and external active regions 6 are formed around the internal active region 4. Pads 8, which are electrodes, are disposed further outside of the external active regions 6, that is, on the circumferential portion of the semiconductor chip 2.

The semiconductor chip 2 is loaded on a die pad 12, which is a boarding portion. Gold wires 10, which are connecting wires, connect an inner lead 14A, which is a part of an external electrode terminal 14 formed to face to the semiconductor chip 2, and pads 8 on the surface of the semiconductor chip 2 as loops.

In such a semiconductor device 200, since pads are disposed on the circumferential portion, time required for designing increases. Also, since the pads must be disposed on specified locations, waste space is produced. Therefore, problems of lowered productivity and increased chip size, as well as accompanying increase in production costs have arisen.

The gold wires 10 connect the inner lead 14A and pads 8 as loops. However, if the gold wires 10 are disposed as loops, the gold wires 10 may approach or contact the circumferential portion 2A of the semiconductor chip 2.

In particular, the semiconductor device 200 is molded by placing the semiconductor chip 2, the die pad 12, gold wires 10, the inner leads 14A, and the like in a prescribed die, and injecting a mold resin 16, which is a mold resin, from the mold resin inlet provided on a corner of the die. Therefore, when the mold resin 16 flows into the die, the mold resin 16 may push down the gold wires 10, and the gold wires 10 may contact to the circumferential portion 2A of the semiconductor chip 2, or may contact to each other.

SUMMARY OF THE INVENTION

As described above, a semiconductor device comprising electrodes disposed outside the external active regions, that is, the circumferential portion of the semiconductor chip has problems of increased time for designing, and increased chip size. Also, since the connecting wires connect electrodes on the semiconductor chips and external electrodes as loops, the connecting wires may contact to the circumferential portion of the semiconductor chip, especially during sealing with a resin.

In order to solve such problems, the present invention proposes a semiconductor device that does not increase time for designing or chip size, and enables the prevention of contact of connecting wires to each other, or to the circumferential portion of the semiconductor chip.

According to one aspect of the present invention, a semiconductor device comprises a semiconductor chip. The semiconductor chip has an internal active region, an external active region, and a plurality of electrodes for electrically connecting the internal active region and the external active region to outside thereof, respectively. The semiconductor device also comprises a boarding portion that carries the semiconductor chip, a plurality of external electrode terminals for electrical connection to an external device, a plurality of connecting wires each connecting the electrode of the semiconductor chip and the external electrode terminal; and a mold resin that seals the semiconductor chip, the boarding portion and the connecting wires. The electrodes are disposed around the internal active region, and the external active region is disposed outside the electrodes. Accordingly, compared with the case of disposing electrodes on the circumferential portion of the semiconductor chip, the time consumed for designing can be shortened, and the size of the semiconductor chip can be minimized.

In another aspect of the present invention, in the semiconductor device, the internal active region is disposed so as to deviate from the center of the semiconductor chip. Accordingly, connecting wires easily pushed down when the mold resin is injected, can be shortened. Therefore, electrodes can be disposed around the internal active region to prevent increase in time for designing and increase in the chip size, as well as the contact of connecting wires with each other, or the connecting wires with the circumferential end portion of the semiconductor chip.

Other and further objects, features and advantages of the invention will appear more fully from the following description.

BRIEF DESCRIPTION OF THE DRAWINGS

FIG. 2 is a table showing the properties of resins used in the mold resin;

FIG. 3 is a table for describing the location of the internal active region disposed on the semiconductor chip, and the state of the gold wire in each sample;

FIG. 4 is a table showing the evaluation of each sample in FIG. 3;

FIG. 9 is a table for describing the locations of the internal active region disposed on the semiconductor chip, and the states of gold wires of the samples;

FIG. 10 is a table showing the evaluation of each sample in FIG. 9;

DETAILED DESCRIPTION OF THE PREFERRED EMBODIMENTS

Figure 1A:
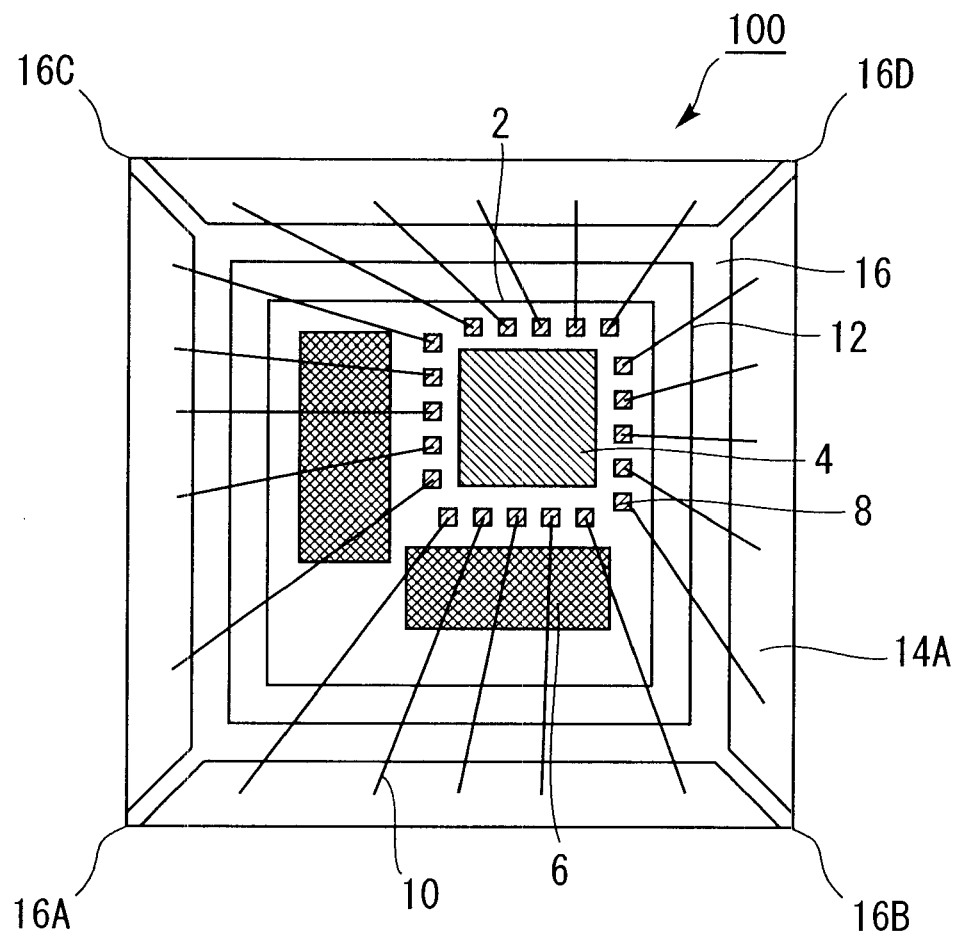
FIG. 1 is a diagram illustrating a semiconductor device according to the embodiment of the present invention, FIG. 1A being a top perspective view thereof, and FIG. 1B being a sectional view thereof.

The embodiment of the present invention will be described below referring to the drawings. In the drawings, the same or corresponding parts will be denoted by the same reference numerals, and the description thereof will be simplified or omitted.

Embodiment

Figure 1B:
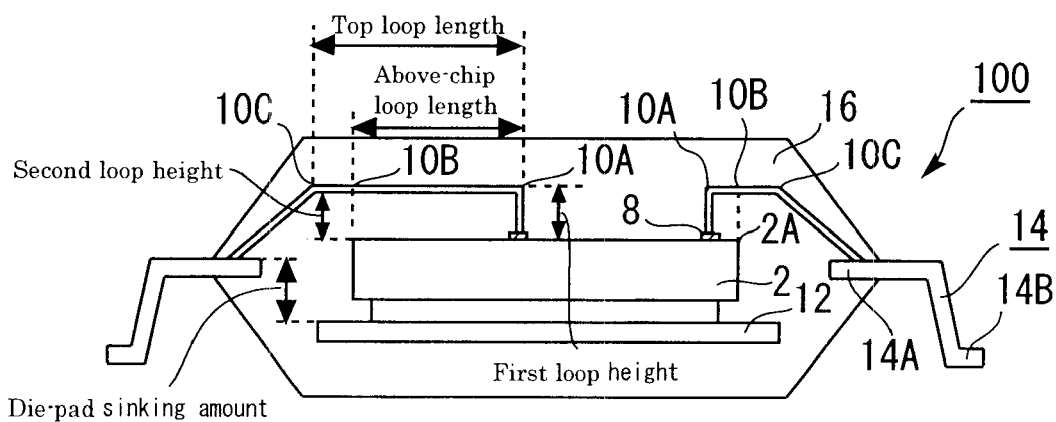

FIG. 1 is a diagram illustrating a semiconductor device according to the embodiment of the present invention, FIG. 1A being a top perspective view thereof, and FIG. 1B being a sectional view thereof. FIG. 2 is a table showing the properties of resins used in the mold resin.

In FIGS. 1A and 1B, the reference numeral 100 denotes a semiconductor device.

Reference numeral 16 denotes a mold resin. The mold resin 16 is used in the package of the semiconductor device 100. In this embodiment, the mold resin 16 is mainly composed of a cresol-based epoxy resin, contains 70% or more inorganic filler, and has properties shown in the column of Mold resin A in FIG. 2.

In the state where the components of the semiconductor device 100 have been assembled as described later, and the assembly is placed in a die, the mold resin 16 is filled in the die through the mold resin inlet on a corner of the die. Thereby, the components of the semiconductor device 100 are sealed.

In FIG. 1A, 16A denotes the mold resin inlet, 16B and 16C denote the right corner and the left corner viewed from the mold resin inlet 16A, respectively, and 16D denotes the corner opposite to the mold resin inlet 16A.

Reference numeral 2 denotes a semiconductor chip, and numeral 12 denotes a die pad. The die pad 12 is the boarding portion to load the semiconductor chip 2. The semiconductor chip 2 is loaded on the die pad 12.

Reference numeral 14 denotes leads, which are external electrode terminals, 14A denotes inner leads, and 14B denotes outer leads. Each of the leads 14 includes an inner lead 14A and an outer lead 14B. The inner leads 14A are disposed around the semiconductor chip 2, and are embedded in the mold resin 16. The outer leads 14B are projected from the mold resin 16, and are terminals for connecting to external electrodes. Although the inner leads 14A are shown as simplified trapezoidal form on the four sides in FIG. 1A, the inner leads 14A actually have irregularity so as to be connected to connecting wires.

Reference numeral 4 denotes an internal active region, and numeral 6 denotes external active regions. The internal active region 4 and external active regions 6 are formed on the surface of the semiconductor chip 2. The internal active region 4 functions as the controller section such as a microcomputer controller, and the external active regions 6 function chiefly as storage sections. Reference numeral 8 denotes pads that function as electrodes. The pads 8 are disposed around the internal active region 4, and electrically connect the internal active region 4 and the external active regions 6 to external devices. Here, each of the pads 8 has a dimension of about 80 $\mu$m×80 $\mu$m.

On the surface of the semiconductor chip 2, the internal active region 4 and the pads 8 disposed around the internal active region 4 are disposed on the location deviated from the center of the surface of the semiconductor chip 2 toward the opposite corner 16D to the mold resin inlet 16A.

In this embodiment, the external active regions 6 are disposed close to locations between the mold resin inlet 16A and the right corner 16B, or between the mold resin inlet 16A and the left corner 16C.

Reference numeral 10 denotes gold wires. The gold wires 10 are connecting wires that connect pads 8 on the semiconductor chip 2 with the inner leads 14A. In this embodiment, the gold wires 10 have a purity of 99.99% or more, and a diameter of 20 $\mu$m or more. Each of the gold wires 10 is connected to a pad 8 at one end, extends upward, bends at the first bending point 10A in the direction substantially parallel to the surface of the semiconductor chip 2, bends at the second bending point 10C in the direction of an inner lead 14A, and is connected to the inner lead 14A at the other end.

In this embodiment, although the length of the gold wires 10 is longest at the part to connect the inner lead 14A disposed on the vicinity of the mold resin inlet 16A with a pad 8, the gold wire 10 in this part is 7.00 mm or shorter. Also, the gold wire 10 to connect the inner lead 14A disposed on the vicinity of the right corner 16B or the left corner 16C with a pad 8 is 6.00 mm or shorter. Furthermore, the length of the gold wires 10 is shortest at the part to connect the inner lead 14A disposed on the vicinity of the opposite corner 16D with a pad 8, and the gold wire 10 in this part is about 3.00 mm.

Also in this embodiment, the gold wires 10 between the first bending point 10A and the second bending point 10C are substantially parallel to the upper surface of the semiconductor chip 2. That is, the first loop height that indicates the distance between the surface of the semiconductor chip 2 and the first bending point 10A is substantially the same as the second loop height that indicates the distance between the surface of the semiconductor chip 2 and the second bending point 10C, and this is about 250 $\mu$m or more in this embodiment.

The above-chip loop length indicating the length from the portion 10B of a gold wire 10 situated above the circumferential end portion 2A, to the first bending point 10A is 30 to 70% of the total length of each gold wire 10. The above-chip loop length is longest in the gold wire 10 having the longest length of about 7.00 mm, and the longest above-chip loop length is approximately 2.10 to 4.90 mm.

The top loop length indicating the length from the first bending point 10A to the second bending point 10C is 70% of the total length of each gold wire 10 or shorter. The top loop length is longest in the gold wire 10 having the longest length of about 7.00 mm, and the longest top loop length is about 4.90 mm.

The top loop length of each gold wire 10 is longer than the above-chip loop length. In other words, the second bending point 10C is in the side of the inner leads 14A relative to the portion 10B of a gold wire situated above the circumferential end portion 2A.

Also, when the position in which the surface of the die pad 12 is in the same height as the upper surface of the inner leads 14A is the reference position of the die pad 12, the die pad 12 is disposed 250 $\mu$m or more below relative to this reference position.

As described above, the first loop height herein is the distance between the surface of the semiconductor chip 2 and the first bending point 10A, and the second loop height is the distance between the surface of the semiconductor chip 2 and the second bending point 10C. The above-chip loop length is the length between the portion 10B of a gold wire 10 situated above the circumferential end portion 2A and the first bending point 10A, and the top loop length is the length between the first bending point 10A and the second bending point 10C. Furthermore, the reference position is the position where the upper surface of the die pad 12 is in the same height as the inner leads 14A, and the die-pad sinking amount is the distance between this reference position and the surface of the die pad 12.

As described above, in the semiconductor device 100, the internal active region 4 on the surface of the semiconductor chip 2 is dislocated in the direction of the opposite corner 16D. Thereby, in charging the mold resin 16, the gold wires 10 disposed on the inner leads 14A in the vicinity of the right corner and the left corner where the gold wires 10 are most easily pushed down can be shortened, and the contact of the gold wires 10 with other adjacent gold wires 10 or the circumferential end portion 2A of the semiconductor chip 2 due to the push down of the gold wires 10 can be prevented.

In order to describe this, the flow of gold wires and other characteristics when the mold resin was injected were checked using samples with different lengths of gold wires by changing the locations and sizes of internal active regions on the semiconductor chip.

FIG. 3 is a table for describing the location of the internal active region disposed on the semiconductor chip, and the state of the gold wire in each sample. FIG. 4 is a table showing the evaluation of each sample.

The schematic diagrams in FIG. 3 show the locations of internal active regions disposed on the surface of the semiconductor chip, and a, b, c, and d indicate the locations corresponding to the mold resin inlet 16A, the right corner 16B, the left corner 16C, and the opposite corner 16D. Although pads for connecting the gold wires are not shown in the schematic diagrams, they are disposed around the internal active regions.

In FIG. 3, Group I from No. 1 to No. 5 and Group II from No. 6 to No. 10 are shown for comparing the flow of the different lengths of gold wires formed by changing the sizes of internal active regions. In other words, the samples in Group I and the samples in Group II have the same longest gold wire length, above-chip loop length, first loop height, and second loop height, respectively.

In each group, the locations of internal active regions disposed of the semiconductor chip are changed. That is, the internal active regions are disposed on the center portion in Samples 1 and 6; and dislocated to the direction d of the opposite corner in Samples 2 and 7, to the direction b of the right corner in Samples 3 and 8, to the direction a of the mold resin inlet in Samples 4 and 9, and to the direction c of the left corner c in Samples 5 and 10.

Referring to FIG. 4, the evaluation of flow of gold wires and other parameters for the above-described samples are described. In FIG. 4, the flow curvature of the gold wire indicates the amount of the flowed gold wire relative to the length of each gold wire when the mold resin is injected; that is, the amount of the dislocation when the gold wire is curved; the approach of the gold wire indicates the distance between adjacent gold wires; and the shift amount of the die pad is the length of the vertical movement of the die pad when the mold resin is injected.

First, the approach of the gold wire is 28 μm or more for the samples in Group I, and 50 μm or more for the samples in Group II.

The minimum distance between the gold wire and the circumferential end portion of the semiconductor chip is longer in Group I than in Group II.

From such results, the lengths of gold wires are considered to be reasonable when the maximum length of the gold wires is 7.00 mm or shorter, the lengths of the gold wires connected to inner leads in the vicinities of the right corner and the left corner are 6.00 mm or shorter.

Figure 5:
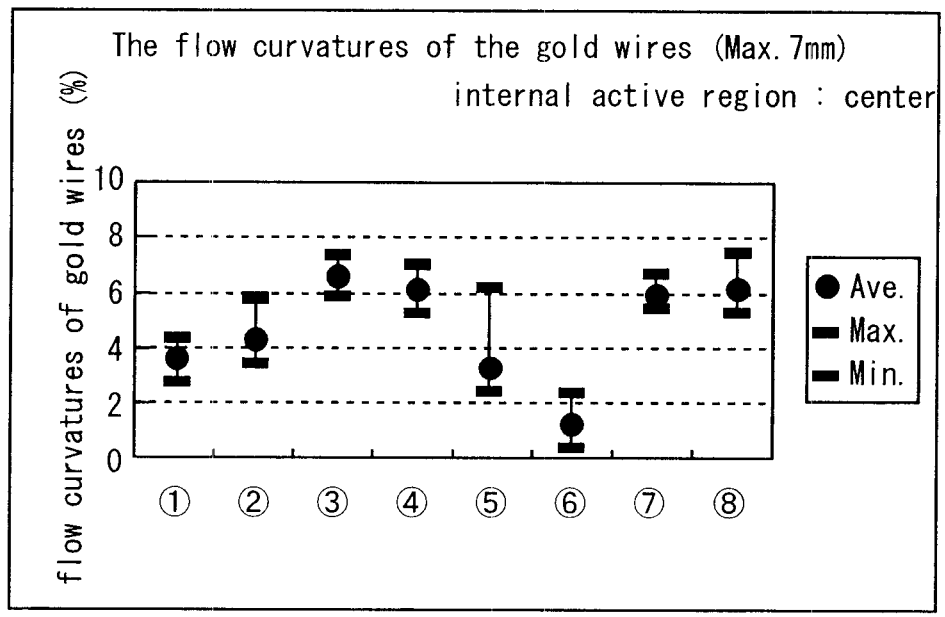
FIGS. 5 and 6 are graphs showing the results of measurements for the flow curvatures of gold wires disposed on the vicinities of each corner in the samples of a semiconductor device having the internal active region disposed on the center of the semiconductor chip.
Figure 6:
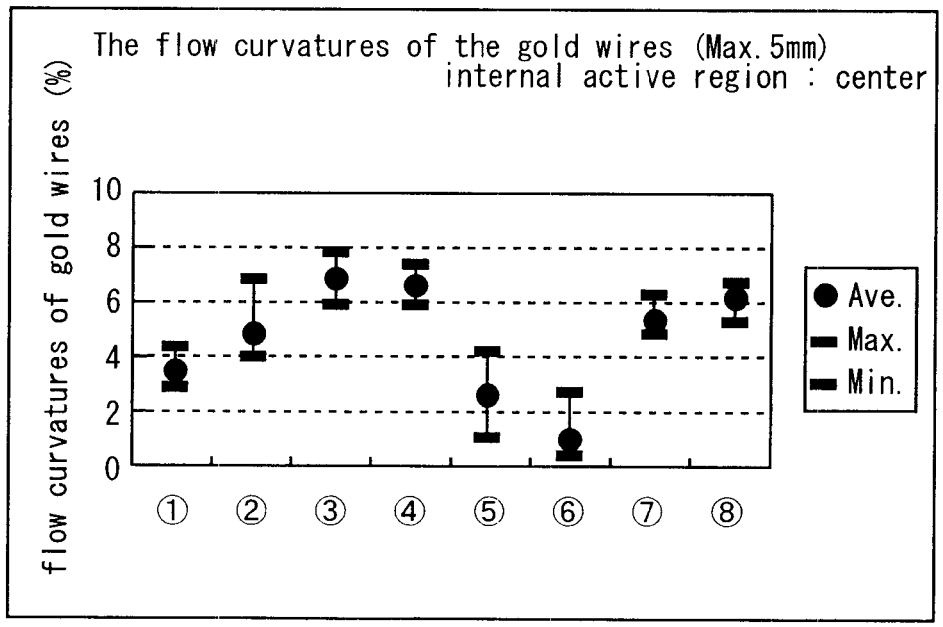

FIGS. 5 and 6 are graphs showing the results of measurements for the flow curvatures of gold wires disposed on the vicinities of each corner in the samples of a semiconductor device having the internal active region disposed on the center of the semiconductor chip. FIG. 5 shows the results when the length of the gold wire is the maximum of about 7.00 mm; and FIG. 6 shows the results when the length of the gold wire is about 5.00 mm.

At ① and ② in FIGS. 5 and 6, flow curvatures of gold wires connected to inner leads closest to the mold resin inlet in both sides of the mold resin inlet are shown; similarly at ③ and ④, at ⑤ and ⑥, and at ⑦ and ⑧, flow curvatures of gold wires connected to inner leads closest to the right corner, the opposite corner, and the left corner, are shown respectively.

From these results, it is known that the largest flow curvature exists in the vicinities of the left corner and the right corner when either the length of the gold wire is 7.00 mm or 5.00 mm.

Furthermore, by the comparison of the results of evaluation of semiconductor chips in each group of FIG. 4, it is known that the minimum distance between the gold wire and the circumferential end portion of the semiconductor chip is largest when the internal active region is disposed on the surface of the semiconductor chip in the direction d of the opposite corner. This is considered because the average length of gold wires is short in the vicinities of the left and right corners when the internal active region is dislocated from the center of the semiconductor chip toward the direction of the opposite corner.

From the above results, it is considered to be most effective for preventing the contact between the gold wire and the circumferential end portion of the semiconductor chip to dislocate the internal active region on the surface of the semiconductor chip in the direction d of the opposite corner.

Also in this embodiment, the first loop height is substantially the same as the second loop height, and the portion of the gold wire 10 between the first bending point 10A and the second bending point 10C is disposed to be substantially parallel to the surface of the semiconductor chip 2. Thereby, the gold wire 10 is prevented from being pushed down, and contacting with other gold wires 10 or the end portions 2A of the semiconductor chip 2 when the mold resin 16 is injected.

In order to describe this, the flow of gold wires and other characteristics when the mold resin was injected were checked using samples with different lengths of gold wires by changing the size of the internal active region on the semiconductor chip, and with different die-pad sinking amounts and top loop lengths.

Figure 7:
FIG. 7 is a table for describing the states of the samples, such as the gold-wire lengths, die-pad sinking amounts, and top loop lengths.
Figure 8:
FIG. 8 is a table showing the evaluation of each sample in FIG. 7.
Figure 11A:
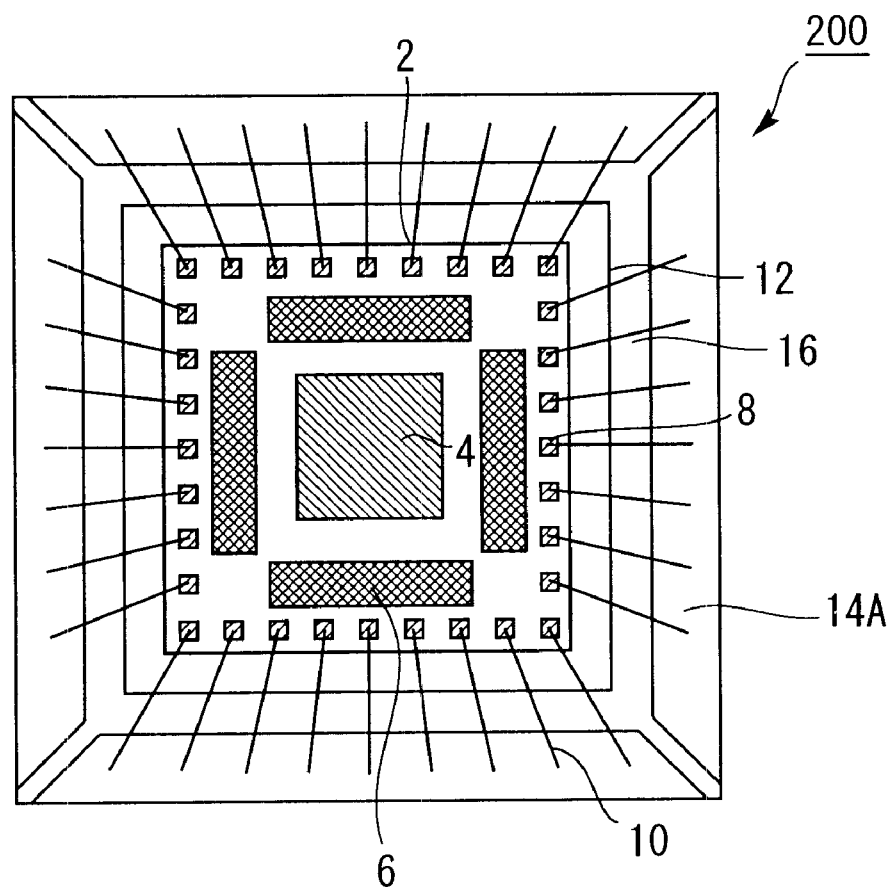
FIG. 11 is a schematic diagram for illustrating a conventional semiconductor device, FIG. 11A being a top perspective view, and FIG. 11B being a sectional view.
Figure 11B:
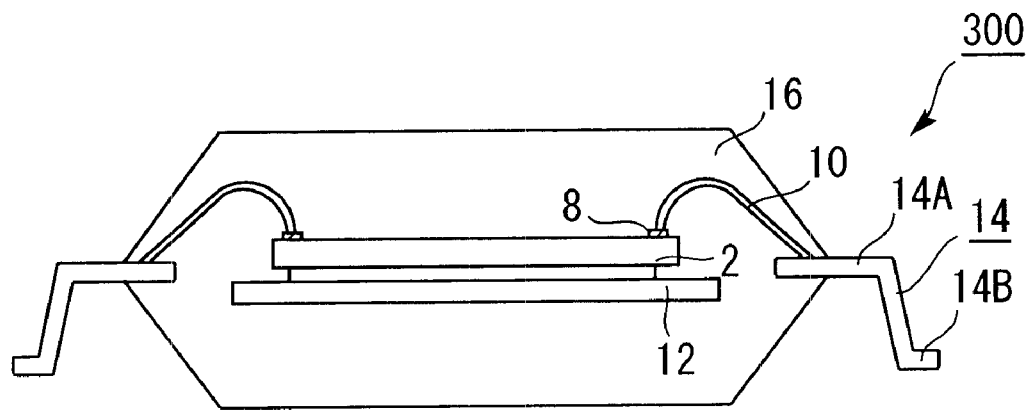

FIG. 7 is a table for describing the states of the samples, such as the gold-wire lengths, die-pad sinking amounts, and top loop lengths; and FIG. 8 is a table showing the evaluation of each sample.

Samples 11 to 13 have different die-pad sinking amounts from Samples 14 and 15.

When Samples 11 to 13 are compared with Samples 14 and 15 referring FIG. 8, Samples 14 and 15, which have gold wires parallel to the semiconductor chip, have larger minimum values of the distance between the gold wire and the circumferential end portion of the semiconductor chip, and larger distances between gold wires, than Samples 11 to 13.

From these results, it is considered that the die-pad sinking amount is preferably 250 μm or more.

Further referring to the tables of FIGS. 3 and 7, although the first loop length is different from the second loop length in Samples 1 to 10 shown in FIG. 3, the first loop length is substantially the same as the second loop length in Samples 11 to 15 shown in FIG. 7. That is, in Samples 11 to 15 shown in FIG. 7, the gold wires in the portion connecting the first bending point and the second bending point are considered to be parallel to the surface of the semiconductor chip.

When the results of evaluations of Samples 1 to 10 and Samples 11 to 15 are compared with each other referring to FIGS. 4 and 8, it is known that the minimum distance between the gold wire and the circumferential end portion of the semiconductor chip is significantly larger in Samples 11 to 15.

This is considered because the location where the gold wire is pushed down is not the portion from the first bending point to the second bending point, but the portion from the second bending point to the inner leads. In other words, this is considered because the tension of the portion from the second bending point to the inner leads when the gold wires are maintained parallel by strongly deforming at the second bending point is higher than the tension of the same portion when the gold wires are not parallel to the semiconductor chip.

From these results, it is considered to be effective for preventing contact of gold wires with each other, that the gold wires in the portion connecting the first bending point and the second bending point are parallel to the surface of the semiconductor chip.

In this embodiment, both the first loop height and the second loop height are 250 μm or higher, the above-chip loop height is 30 to 70% of the entire length of the gold wires, the top loop length is 70% of the entire length of the gold wires or shorter, and the second bending point 10C is disposed in the location closer to the inner leads than above the circumferential end portion of the semiconductor chip. Thereby, when the mold resin was injected, the push-down and contact with other gold wires can be prevented.

In order to describe this, the flow of gold wires and other characteristics when the mold resin was injected were checked using samples with different locations of the internal active region disposed on the semiconductor chip, gold-wire lengths, above-chip loop lengths, top loop lengths, first loop lengths and second loop lengths.

FIG. 9 is a table for describing the locations of the internal active region disposed on the semiconductor chip, and the states of gold wires of the samples; and FIG. 10 is a table showing the evaluation of each sample.

Sample 4 and Sample 5 are samples only having the different first and second loop heights. When Sample 4 and Sample 5 are compared with each other referring to FIG. 10, Sample 5 having higher loop height can increase the distance between the gold wires and the circumferential end portion of the semiconductor chip.

From these results, it is considered that the larger first and second loop heights are preferable, preferably 250 μm or higher.

Sample 7 and Sample 8 are samples only having the different ratios of the top loop length to the entire gold wire length. When Sample 7 and Sample 8 are compared with each other referring to FIG. 10, it is known that longer top loop length can increase the distance between the gold wires and the circumferential end portion of the semiconductor chip.

In Samples 1 to 4, above-chip lengths are changed about from 10% to 65% of the gold wire length. When Samples 1 to 4 are compared with one another referring to FIG. 10, it is known that above-chip lengths may be changed to about 70% of the gold-wire length.

In this embodiment, as described above, pads 8 are disposed around the internal active region 4, and external active regions 6 are disposed outside the pads 8. Therefore, in comparison with disposing pads on the circumferential portion of the semiconductor chip, the time consumed for designing can be shortened, and the size of the semiconductor chip can be minimized.

Also in this embodiment, the length and shape of gold wires 10 and the location of the die pad 12 are determined considering the flow of the gold wires 10 when the mold resin 16 is injected. Therefore, contact of the gold wires 10 with each other, and contact of the circumferential end portion 2A of the semiconductor chip 2 with the gold wires 10 can be prevented effectively.

In this embodiment, the internal active region 4 is dislocated to the direction toward the opposite corner 16D. As described above, this is for preventing the contact of the gold wires 10 by effectively shortening the gold wires 10 close to the right corner 16B and the left corner 16C where the gold wires 10 are easily flowed. However, the location of the internal active region 4 is not limited to this, but can be dislocated in any directions from the center. If the shape of the gold wires 10 or the like is considered, the internal active region 4 may be disposed on the center of the semiconductor chip 2.

In the semiconductor chip 2 of this embodiment, no external active regions are disposed in the vicinities of portions connecting the opposite corner 16D with the right corner 16B or the left corner 16C, to sufficiently dislocate the internal active region 4 in the direction of the opposite corner. However, the present invention is not limited to this, but external active regions may be disposed on any space on the surface of the semiconductor chip remaining after the internal active region has been disposed. Also, the amount of dislocation of the internal active region from the center may be decreased, and small external active regions may be disposed on the space produced between the internal active region and portions connecting the opposite corner 16D with the right corner 16B or the left corner 16C.

Also in this embodiment, the die-pad sinking amount is 250 μm or more, because this range is the effective value for preventing the contact of gold wires 10 with the circumferential end portion 2A of the semiconductor chip 2. Therefore, the back face of the die pad may be exposed from the mold resin. However, the die-pad sinking amount is not limited thereto, but the die-pad sinking amount may be less than 250 μm, if the location of internal active region, and the length and the connection of the gold wires are considered.

Also in this embodiment, gold wires 10 between the first bending point 10A and the second bending point 10B are disposed so as to be parallel to the semiconductor chip 2. Also, the loop height is 250 μm or more. The top loop length, and the above-chip loop length are 70% or less, and about 30% to 70% of length of each gold wire 10, respectively. This is because these conditions effectively prevent the contact of gold wires 10 with each other, and gold wires 10 with the circumferential end portion 2A of the semiconductor chip 2 when the mold resin 16 is injected. However, all of these conditions may not be necessarily met, but some of these conditions may be met within the range to be able to prevent contact.

Also in this embodiment, although the mold resin A consisting mainly of a cresol-based epoxy resin, containing 70% or more inorganic filler, and having resin properties shown in FIG. 2, is used as the mold resin 16, the present invention is not limited thereto, but the mold resin B having properties shown in FIG. 2 may also be used.

Also in this embodiment, although the gold wires 10 having a purity of 99.99% or higher, and a diameter of 23 μm are used as connecting wires, the present invention is not limited thereto.

Also, although pads each having a size of 80 μm×80 μm are used as electrodes, the present invention is not limited thereto. However, the size of each electrode is preferably 50 μm×50 μm or larger for the ease of bonding the gold wire to the electrode.

Furthermore, although this embodiment is described by using a package having inner leads and outer leads as the external electrode terminals, the present invention is not limited thereto, but can be applied to other packages, such as a package having ball-shaped external electrode terminals on the back face of the boarding table.

Also in this embodiment, the lengths of the gold wires 10 are changed by changing the location of the internal active region 4 on the semiconductor chip 2, and the form of the connection of the gold wires is changed, to prevent the contact of the gold wires, but the locations of disposing pads or inner leads may be changed so that the above-described conditions are met.

Furthermore, in order to cope with the portions where gold wires are significantly flowed, the locations of pads or inner leads may especially be changed.

The features and the advantages of the present invention as described above may be summarized as follows.

According to one aspect of the present invention, in a semiconductor device, electrodes are disposed around the internal active region, and external active regions are disposed outside the internal active region. Accordingly, compared with the case of disposing electrodes on the circumferential portion of the semiconductor chip, the time consumed for designing can be shortened, and the size of the semiconductor chip can be minimized.

In another aspect of the present invention, in the semiconductor device, the internal active region may be dislocated on the semiconductor chip. Accordingly, connecting wires easily pushed down when the mold resin is injected, can be shortened. Therefore, electrodes can be disposed around the internal active region to prevent increase in time for designing and increase in the chip size, as well as the contact of connecting wires with each other, or the connecting wires with the circumferential end portion of the semiconductor chip.

In another aspect of the present invention, in the semiconductor device, the length of connecting wires, the form of connection, or the location of the boarding portion to load the semiconductor chip may be designed so that the connecting wires are not easily pushed down when the mold resin is injected. Accordingly, the contact of connecting wires with each other, or the connecting wires with the semiconductor chip can be prevented, and a stable semiconductor device can be obtained.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-280020, filed on Sep. 14, 2001 including specification, claims, drawings and summary, on which the Convention priority of the present application is based, are incorporated herein by reference in its entirety.

What is claimed is:

1. A semiconductor device, comprising:
   a semiconductor chip having an internal active region, an external active region, and a plurality of electrodes for electrically connecting said internal active region and said external active region to outside thereof, respectively;
   a boarding portion that carries said semiconductor chip;
   a plurality of external electrode terminals for electrical connection to an external device;
   a plurality of connecting wires each connecting said electrode of said semiconductor chip and said external electrode terminal; and
   a mold resin that seals said semiconductor chip, said boarding portion, and said connecting wires;
   wherein said electrodes are disposed around said internal active region, and said external active region is disposed outside said electrodes.

2. The semiconductor device according to claim 1, wherein said internal active region is disposed so as to deviate from the center of said semiconductor chip.

3. The semiconductor device according to claim 2, wherein said internal active region is disposed in the direction opposite to a mold resin inlet foe filling said mold resin.

4. The semiconductor device according to claim 1, wherein said external electrode terminals include outer leads to be connected to external devices and an inner leads disposed around said semiconductor chip within said mold resin.

5. The semiconductor device according to claim 4, wherein the surface of said boarding portion is disposed on the position lower than said inner leads by 250 $\mu$m or more.

6. The semiconductor device according to claim 1, wherein the length of said connecting wires disposed on the vicinity of said mold resin inlet and on the vicinity of the corner opposite to said mold resin inlet is 7.0 mm or shorter, and the length of said connecting wires disposed on the vicinity of other two corners is 6.0 mm or shorter.

7. The semiconductor device according to claim 1, wherein each of said connecting wires has a first bending point and a second bending point between an end connecting to said electrode of said semiconductor chip and the other end connecting said external electrode terminal, and
   said first bending point is positioned above said electrode of said semiconductor chip, and the distance from the surface of said semiconductor chip to said first bending point is 250 $\mu$m or longer.

8. The semiconductor device according to claim 1, wherein each of said connecting wires has a first bending point and a second bending point between an end connecting to said electrode of said semiconductor chip and the other end connecting said external electrode terminal, and
   each of the length of said connecting wire disposed between said first bending point and the point positioned above the circumferential end of said semiconductor chip is 30% to 70% of the entire length of said connecting wires.

9. The semiconductor device according to claim 1, wherein each of said connecting wires has a first bending point and a second bending point between an end connecting to said electrode of said semiconductor chip and the other end connecting said external electrode terminal, and
   each of the length of said connecting wire from said first bending point to said second bending point is 70% or less of the entire length of said connecting wires.

10. The semiconductor device according to claim 1, wherein each of said connecting wires has a first bending point and a second bending point between an end connecting to said electrode of said semiconductor chip and the other end connecting said external electrode terminal, and
    the circumferential end of said semiconductor chip is positioned between said first bending point and said second bending point.

11. The semiconductor device according to claim 1, wherein each of said connecting wires has a first bending point and a second bending point between an end connecting to said electrode of said semiconductor chip and the other end connecting said external electrode terminal, and
    the portion connecting said first bending point and said second bending point of said connecting wire is substantially parallel to the surface of said semiconductor chip.

12. The semiconductor device according to claim 1, wherein the lower surface of said boarding portion is exposed from said mold resin.

13. The semiconductor device according to claim 1, wherein said connecting wires are gold wires of a purity of 99.99% or more.

14. The semiconductor device according to claim 1, wherein the diameter of said connecting wires is 20 μm or more.

15. The semiconductor device according to claim 1, wherein said mold resin is mainly composed of a cresol novolak-based epoxy resin or a biphenyl-based epoxy resin, and contains 70% or more inorganic filler.

16. The semiconductor device according to claim 15, wherein the flow properties of the resin in said mold resin are a spiral flow of 100 cm or more, and a melt viscosity of 15.0 Pa·s or less.

17. The semiconductor device according to claim 1, wherein the size of each of said electrodes of said semiconductor chip is 50 μm×50 μm or larger.

* * * * *